(12) United States Patent
Schwartz et al.

(10) Patent No.: US 10,406,623 B2
(45) Date of Patent: Sep. 10, 2019

(54) METHOD AND APPARATUS FOR PROVIDING AUXILIARY AND WELDING TYPE POWER WITH THERMAL PROTECTION

(71) Applicant: Illinois Tool Works Inc., Glenview, IL (US)

(72) Inventors: Brian A. Schwartz, Appleton, WI (US); Quinn W. Schartner, Kaukauna, WI (US)

(73) Assignee: Illinois Tool Works Inc., Glenview, IL (US)

( * ) Notice: Subject to any disclaimer, the term of this patent is extended or adjusted under 35 U.S.C. 154(b) by 1250 days.

(21) Appl. No.: 14/535,773

(22) Filed: Nov. 7, 2014

(65) Prior Publication Data

US 2016/0129520 A1    May 12, 2016

(51) Int. Cl.
| | |
|---|---|
| *B23K 9/10* | (2006.01) |
| *H05K 7/20* | (2006.01) |
| *H01F 27/40* | (2006.01) |
| *H01F 38/08* | (2006.01) |

(52) U.S. Cl.
CPC ......... *B23K 9/1043* (2013.01); *B23K 9/1006* (2013.01); *H01F 27/402* (2013.01); *H01F 38/085* (2013.01); *H05K 7/20136* (2013.01); *H01F 2027/406* (2013.01)

(58) Field of Classification Search
CPC ....... B23K 9/1006; B23K 9/1043; B23K 9/32
USPC ............ 219/130.21, 130.31, 130.32; 336/55; 165/11.1
See application file for complete search history.

(56) References Cited

U.S. PATENT DOCUMENTS

| | | | |
|---|---|---|---|
| 2,866,147 A | 12/1958 | Bichsel | |
| 6,153,851 A * | 11/2000 | Schneider | B23K 9/1043 219/121.39 |
| 8,426,772 B2 * | 4/2013 | Luo | B23K 9/1006 219/130.21 |
| 2004/0145437 A1 * | 7/2004 | Lee | H01F 27/402 336/55 |
| 2006/0198171 A1 | 9/2006 | Samodell | |
| 2013/0112367 A1 * | 5/2013 | Kooken | B23K 9/1006 165/11.1 |
| 2014/0021180 A1 | 1/2014 | Vogel | |

OTHER PUBLICATIONS

International Search Report, dated Feb. 1, 2016, European Patent Office, Rijswijk, Netherlands.

* cited by examiner

*Primary Examiner* — Tu B Hoang
*Assistant Examiner* — Thomas J Ward
(74) *Attorney, Agent, or Firm* — George R. Corrigan

(57) ABSTRACT

A method and apparatus for providing welding-type power supply includes a power circuit and a controller. The power circuit receives input power and provides welding type power and auxiliary power. It is controlled on a control input. The power circuit also includes an auxiliary power transformer. A temperature responsive component is mounted in the auxiliary power transformer and provides a temperature signal indicative of the temperature in the auxiliary power transformer. The controller controls a cooling fan for the aux power transformer and/or turns off the aux power output in response to the sensed temperature.

13 Claims, 5 Drawing Sheets

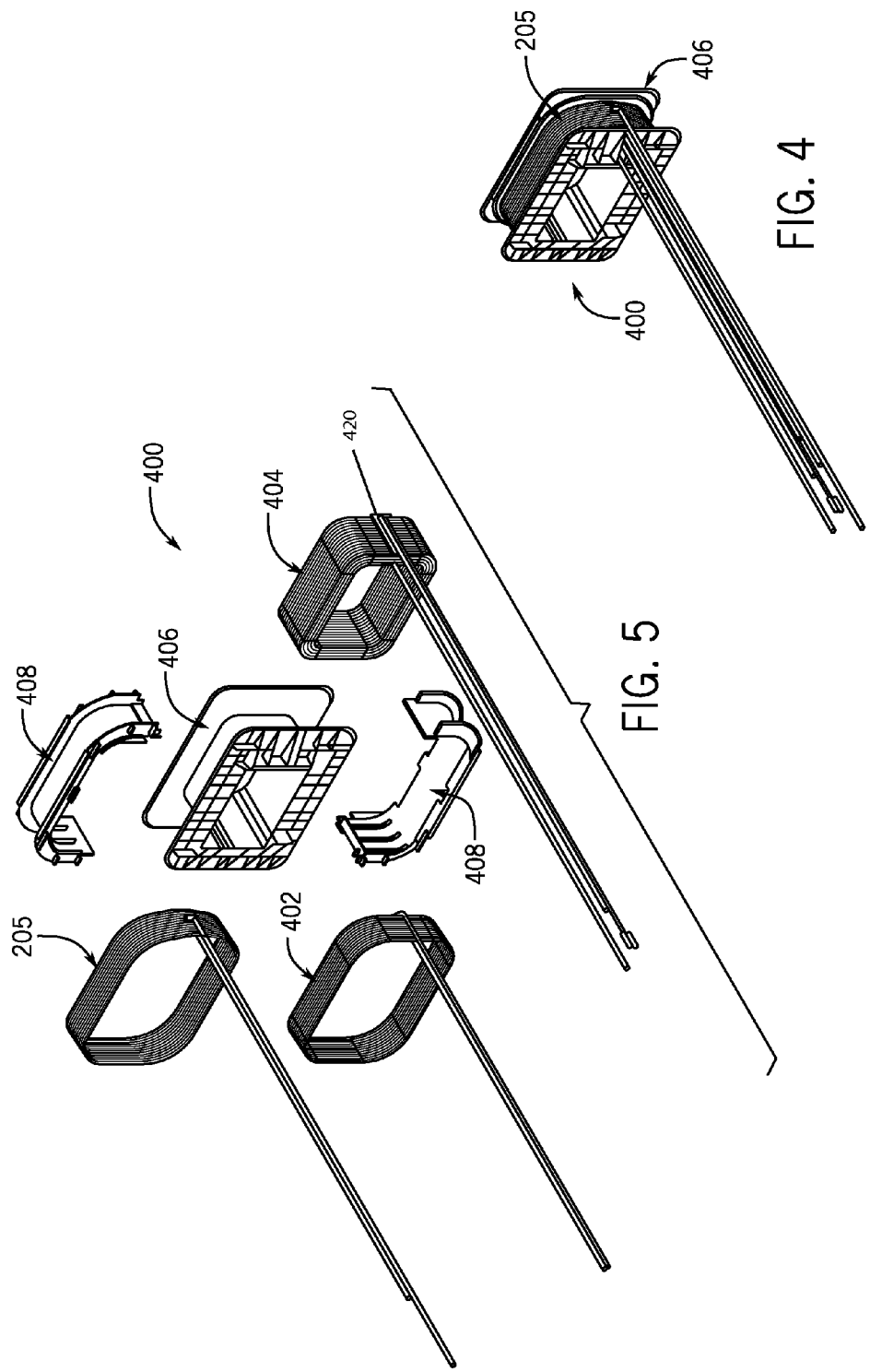

METHOD AND APPARATUS FOR PROVIDING AUXILIARY AND WELDING TYPE POWER WITH THERMAL PROTECTION

FIELD OF THE INVENTION

The present disclosure relates generally to welding type power supplies having electrical transformers. More specifically, it relates to transformers for use in creating auxiliary power.

BACKGROUND OF THE INVENTION

Transformers are commonly used in welding type power supplies. Welding type power supply, as used herein, is a power supply that provides a welding type output. Welding type output, as used herein, is an output suitable for welding, plasma cutting, or induction heating. Welding type power supplies have a wide variety of topologies. For example, they can include a preregulator to provide a bus, and have an output converter that converts the bus into a desired current and voltage. Examples of preregulators include boosts, bucks, rectifiers, etc. Examples of output converters, include inverters, boosts, bucks, choppers, etc. Welding type power supplies can have additional, intermediate stages, and can receive utility power as input power, or include a generator.

Many welding type power supplies include an auxiliary power output. This is often provided at 120 volts (or other utility voltages power), and can be derived by transforming input power, or derived from a bus by a converter (such as inverter). Auxiliary power derived by inverting the bus is also usually transformed (to provide the desired 120V ac). Thus, when auxiliary power is provided it is common to have an auxiliary power transformer. Auxiliary power, as used herein, includes power provided other than on the main power output of a welding type power supply.

Many welding type power supplies include a weld power transformer that handles the primary welding type output of the power supply. Weld power transformers can become overheated and are typically cooled by a fan (or fans). Some prior art welding type power supplies turn the fan(s) on and off as needed, in response to the temperature of the welding transformer.

The auxiliary power transformer is often cooled by the same fan as the weld transformer. However, the prior art does not use the temperature of the auxiliary transformer to determine when the fan should be turned on and off. Thus, cooling is only provided when the weld transformer becomes hot. Accordingly, a welding-type power supply that has an auxiliary power transformer that is cooled by a fan controlled in response to the auxiliary power transformer temperature is desired.

SUMMARY OF THE PRESENT INVENTION

According to a first aspect of the disclosure a welding-type power supply includes a power circuit and a controller. The power circuit receives input power and provides welding type power and auxiliary power, and is controlled on a control input. The power circuit also includes an auxiliary power transformer. A temperature responsive component is mounted in the auxiliary power transformer, and the component provides a temperature signal indicative of the temperature in the auxiliary power transformer. The controller has a control output connected to the control input, and has a temperature control input connected to receive the temperature signal. A thermal protection module receives the temperature control input, and the control output is responsive to the thermal protection module.

According to a second aspect of the disclosure a method of protecting a welding-type power supply includes receiving input power and converting it to welding power, and controlling the converting and transforming. The converting includes transforming power with an auxiliary transformer into auxiliary power. The temperature of the auxiliary transformer is sensed and the transforming is controlled in response to the sensing.

The power circuit includes at least one fan that cools at least the auxiliary power transformer in one alternative. The fan is turned on and off by a fan on/off module that is part of the thermal protection module.

The fan on/off module includes a fan off set point that corresponds to a fan off temperature, and a fan on set point that corresponds to a fan on temperature, and the fan off temperature is less than the fan on temperature in another alternative.

The thermal protection module includes an auxiliary power shut down module in one embodiment.

The auxiliary power shut down module includes a shut down set point that corresponds to a shut down temperature that is greater than the fan on temperature in various embodiments.

The power circuit includes an auxiliary power output and a relay responsive to the shut down module is in electrical communication with the auxiliary power output and the auxiliary power transformer, and wherein the relay is responsive to the shut down module in another embodiment.

The temperature responsive component is a thermistor in one embodiment.

The auxiliary power transformer includes a utility power winding, a control power winding, and a winding separator therebetween, and the thermistor is mounted to and under the winding separator in various embodiments.

Other principal features and advantages of will become apparent to those skilled in the art upon review of the following drawings, the detailed description and the appended claims.

BRIEF DESCRIPTION OF THE DRAWINGS

FIG. 4 is a perspective view of a secondary assembly of FIGS. 2 and 3;
FIG. 5 is an exploded view of the secondary assembly of FIG. 4.

Figure 1:
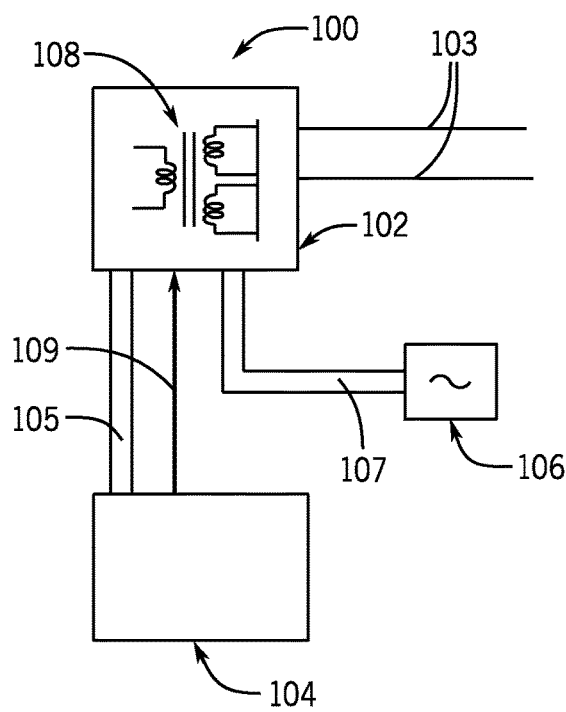
FIG. 1 is a block diagram of a welding type power supply.

Before explaining at least one embodiment in detail it is to be understood that the invention is not limited in its application to the details of construction and the arrangement of the components set forth in the following description or illustrated in the drawings. The invention is capable of other embodiments or of being practiced or carried out in various ways. Also, it is to be understood that the phraseology and terminology employed herein is for the purpose of

DETAILED DESCRIPTION OF THE PREFERRED EMBODIMENTS

While the present disclosure will be illustrated with reference to a particular welding type power supply, controller and transformer, it should be understood at the outset that the invention can also be implemented with other welding type power supplies, controllers, transformers, and other components.

Generally, in accordance with the invention a welding type power supply 100 (FIG. 1) includes a power circuit 102 and a control circuit 104. Other items, such as a generator, wire feeder, welding gun, robot, etc. can be included. Welding type power supply 100 also includes an auxiliary power output module 106, to which utility power (or other aux power) is provided on output 107. In the preferred embodiment module 106 provides 120 VAC at 60 Hz to the user.

Power circuit 102 receives input power, such as power from a utility or generator, and provides welding type power on a welding output 103. In the preferred embodiment power circuit 102 includes a preregulator, a high voltage split bus, and a stacked inverter output, such as that shown in patent application Ser. No. 13/839,235, published as US-2014-0021180-A1, hereby incorporated by reference. Alternatives provide for using other topologies. Power circuit 102 includes a transformer 108 which receives power and provides control and aux power. In the preferred embodiment the input to the primary of transformer 108 is a power derived from a bus, such as by an inverter. The primary may alternatively be connected to utility or generator input power.

Control power is provided on output 105 to controller 104. Controller 104 (also called a control circuit) may be located on one or more boards in one or more places, and can include analog and digital components, including processors, and can include software. Control circuit 104 is connected on output 109 to control power circuit 102, and preferably controls power circuit 102 using PWM. Control circuit may also receive feedback, such as of the load, the bus voltages, the type of input, etc. It may also receive user inputs, such as process selection, set points, etc. Controller, as used herein, includes digital and analog circuitry, discrete or integrated circuitry, DSPs, microprocessors, etc., and software, hardware and firmware, located on one or more boards, used to control a device such as a power supply.

Figure 2:
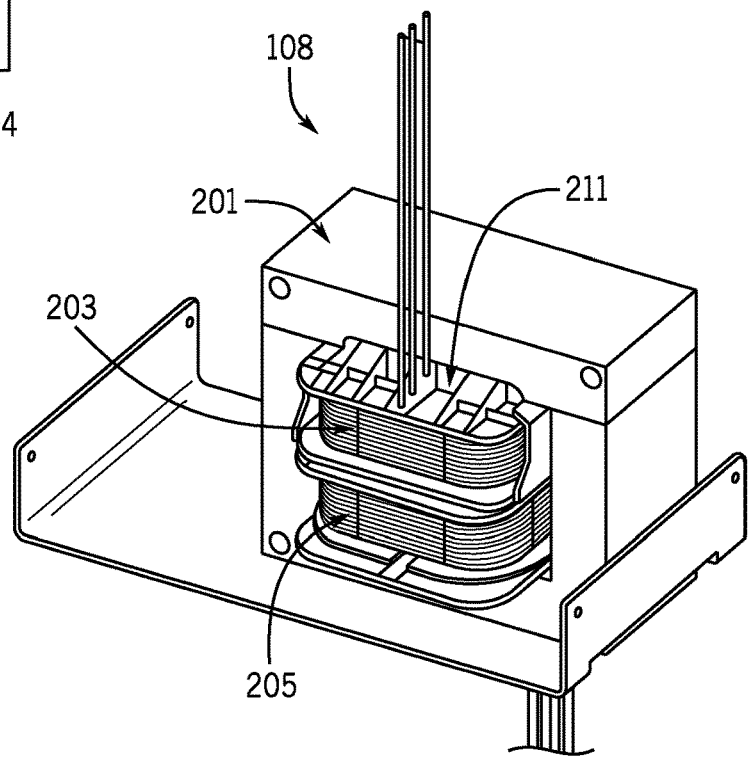
FIG. 2 is a perspective view of a transformer.
Figure 3:
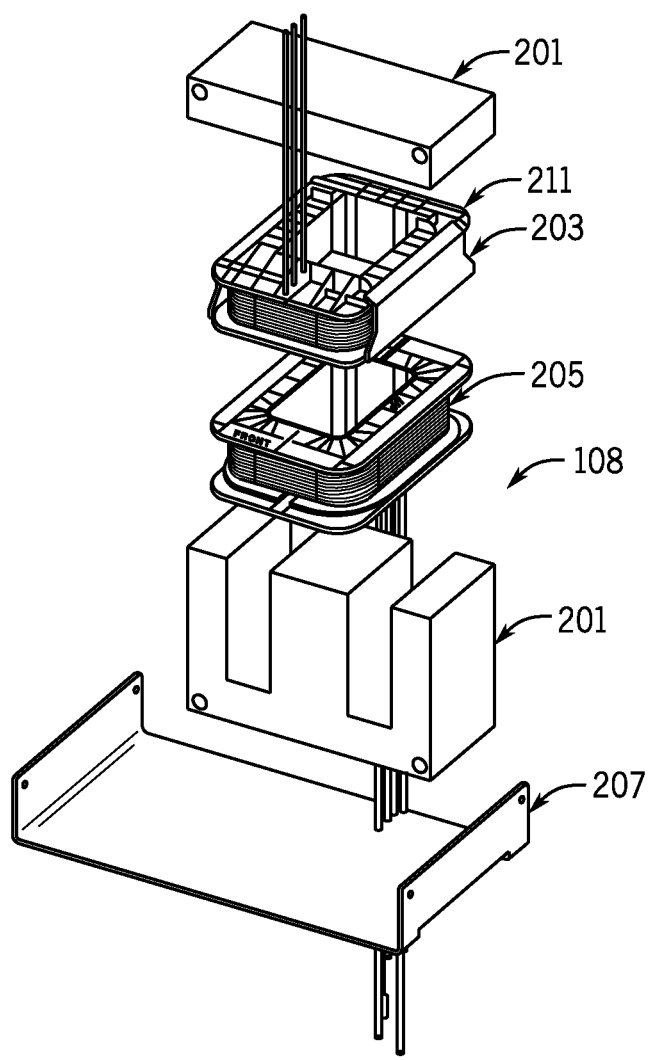
FIG. 3 is an exploded view of the transformer of FIG. 2.

Transformer 108 is shown in FIGS. 2 and 3, and includes a core 201, a primary winding 203, secondary windings 205 and a mounting plate 207. Primary winding 203 is preferably wound about a bobbin 211.

Secondary windings 205 are shown in more detail in FIGS. 4 and 5, as part of secondary assembly 400. Secondary assembly 400 includes control power secondary winding 205, an additional control power secondary winding 402 (two control power windings are used to provide two different voltages (24V and 36V in the preferred embodiment), an aux power secondary winding 404, a bobbin 406, and a winding separator 408. The outputs of windings 205 and 402 are provided on lines 105 to control circuit 104. The output of winding 404 is provided on lines 107 to aux module 106.

Alternatives provide for using one control power winding, omitting the aux or control power windings, and/or omitting the winding separator, or changing the order of the windings, such that one or both control windings are under the separator, and the aux power winding is above the separator. Also, windings for other purposes, including a weld power winding, could be included.

Secondary assembly 400 is assembled with winding 404 wound about bobbin 406. Winding separator 408 is placed over winding 404. Winding separator, as used herein, is a part that is formed or shaped to separate windings, and that provides structure about which a winding may be wound. It does not include tape. Then, winding 402 is wound about winding separator 408. Winding 205 is wound over winding 402 (paper can be used to separate windings 205 and 402). Winding separator 408 provides insulation and increases the creepage distance between windings 404 and 402. Also, winding separator 408 provides for air flow past winding 205 to winding 402. Air flow is also provided to winding 404 in some embodiments. Alternatives provide for not including provisions for air flow.

A thermistor 420 is mounted over winding 404 and is used by controller to protect transformer 108 from overheating. Generally, when controller 104 determines that transformer 108 needs cooling, based on the temperature dependent resistance of thermistor 420, controller 108 commands one or more fans to be turned on. When transformer 104 no longer needs cooling, the fans is turned off. If the temperature is too high, the aux output is disabled, to reduce the heating of transformer 104. Alternatives provide for using other temperature responsive components, such as thermocouples, digital temperature sensors, or other temperature sensitive devices.

Figure 6:
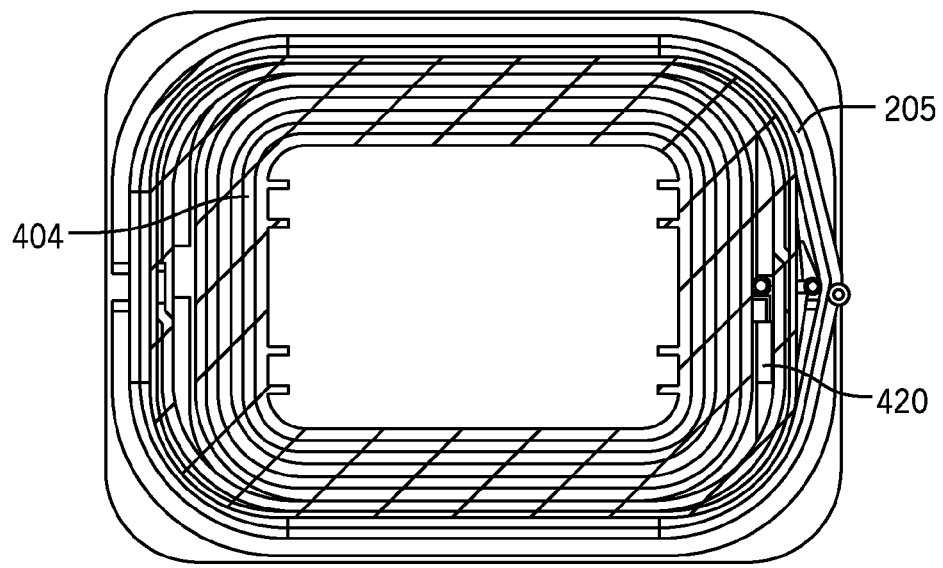
FIG. 6 is a cross sectional view of the windings of FIG. 4.

Turning now to FIG. 6, a cross sectional view of windings 205 and 404 is shown, with thermistor 420 disposed between the windings. Alternatives include locating the thermistor elsewhere, such as near the primary, under the aux power winding, between control windings, on the core, etc.

Figure 7:
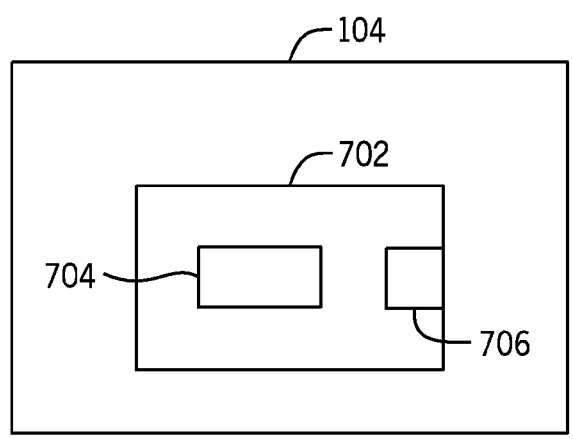
FIG. 7 is a block diagram of the controller of FIG. 1.

FIG. 7 is a block diagram of the portion of controller 104 that relates to protecting the transformer, including a thermal protection module 702, a fan on/off module 704, and a auxiliary power shut down module 706. Module, as used herein, includes software and/or hardware that cooperates to perform one or more tasks, and can include digital commands, power circuitry, networking hardware, etc. Thermal protection module, as used herein is a module that provides thermal protection to at least part of a welding type power supply. Fan on/off module, as used herein is a module that causes a fan to be turned on or off. Auxiliary power shut down module, as used herein is a module that causes the aux power (or a portion thereof) to be shut down, such that it is not available to the user.

Controller 104 receives the temperature signal from thermistor 420, and provides it to thermal protection module 702. Thermal protection module 702 includes a voltage divider with precision resistors (and thermistor 420) that correlates the resistance of thermistor 420 to a temperature. The temperature signal is provided to fan on/off module 704 and auxiliary power shut down module 706.

When the temperature rises above a fan on set point, fan on/off module 704 turns on a fan 515 (see FIG. 9), because the control output is responsive to thermal protection module 702. The control output provides both PWM control and thermal protection control, and is preferably comprised of multiple conductors. When the temperature falls below a fan off set point, fan on/off module 704 turns off fan using a fan off signal 515. Preferably, the fan on set point is above the fan off set point, to prevent short cycling of fan 515.

Figure 8:
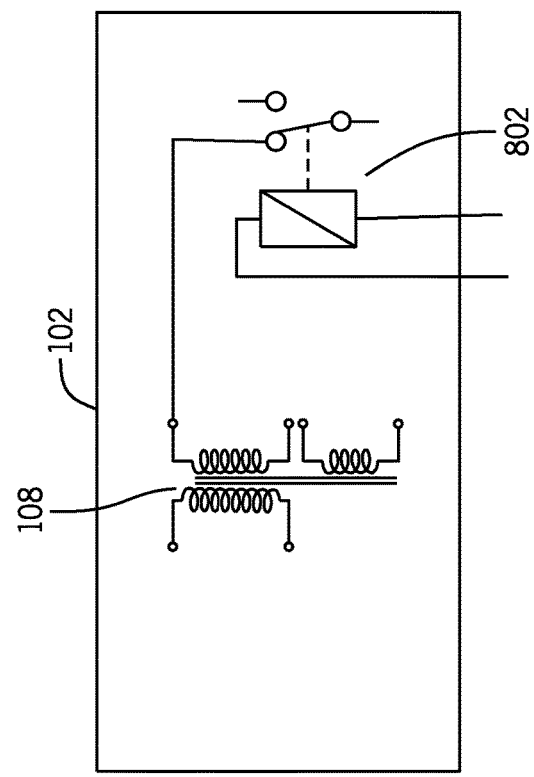
FIG. 8 is a block diagram of the power circuit of FIG. 1.

When the temperature rises above a shut down set point, auxiliary power shut down module 706 shuts down the auxiliary power output. Preferably, the shut down set point is above the fan on set point. The preferred embodiment provides for turning off a relay 802 (see FIG. 8) which is in the auxiliary power output circuit. Alternatives provide for using electronic switches (FETs, etc) in place of relay 802, with relay 802, or in other locations to shut off aux power.

Figure 9:
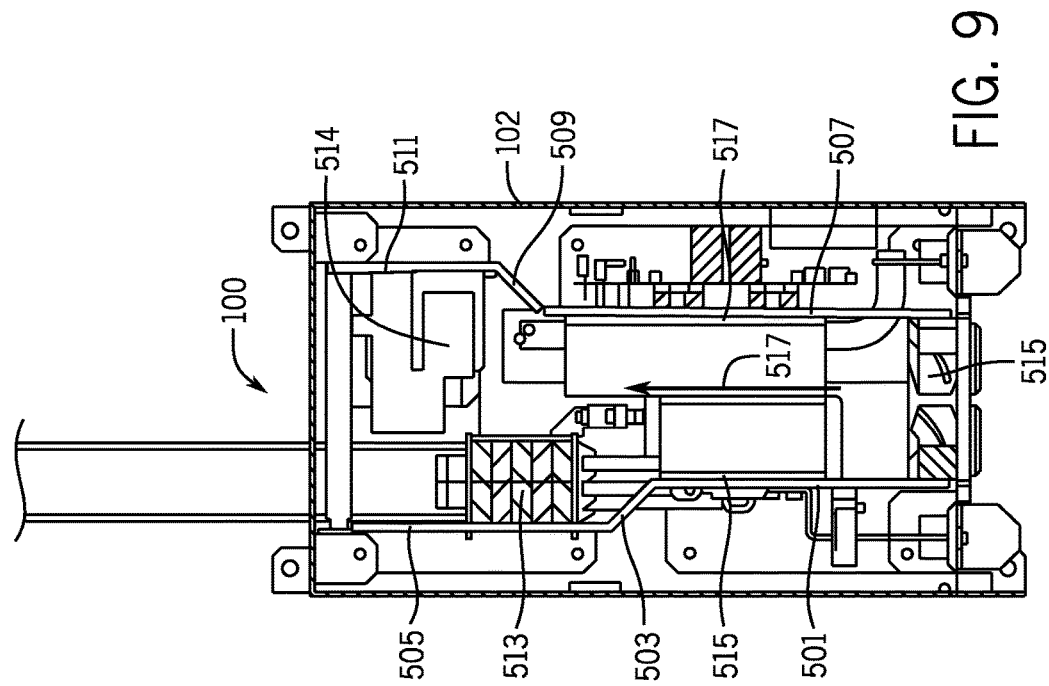
FIG. 9 is a top view of the interior of the welding type power supply of FIG. 1.

FIG. 9 is a top view of the interior of welding type power supply 100 and shows a wind tunnel defined by sides 501, 503, 505, 507, 509 and 511. Fan 515 cools an HF weld transformer 513 and an aux transformer 514, along with other components. Alternatives provide for using two or more fans.

Numerous modifications may be made to the present disclosure which still fall within the intended scope hereof. Thus, it should be apparent that there has been provided a method and apparatus for providing welding and auxiliary power with thermal protection for the aux power that fully satisfies the objectives and advantages set forth above. Although the disclosure has been described specific embodiments thereof, it is evident that many alternatives, modifications and variations will be apparent to those skilled in the art. Accordingly, the invention is intended to embrace all such alternatives, modifications and variations that fall within the spirit and broad scope of the appended claims.

The embodiments of the invention in which an exclusive property or privilege is claimed are defined as follows:

1. A welding-type power supply comprising:
   a power circuit disposed to receive input power and provide welding type power and auxiliary power, and having a control input, wherein the power circuit includes an auxiliary power transformer having a secondary winding;
   a temperature responsive component mounted over the secondary winding of the auxiliary power transformer, that provides a temperature signal indicative of the temperature in the auxiliary power transformer; and
   a controller, having a control output connected to the control input, and having a temperature control input connected to receive the temperature signal, and having a thermal protection module that receives the temperature control input, and wherein the control output is responsive to the thermal protection module.

2. The welding-type power supply of claim 1, wherein the power circuit includes at least one fan mounted to cool at least the auxiliary power transformer, and wherein the at least one fan is responsive to a fan on/off signal, and wherein the thermal protection module includes a fan on/off module, and wherein the fan on/off signal is responsive to the temperature signal.

3. The welding-type power supply of claim 2, wherein the fan on/off module includes a fan off set point that corresponds to a fan off temperature, and a fan on set point that corresponds to a fan on temperature, wherein the fan off temperature is less than the fan on temperature.

4. The welding-type power supply of claim 3, wherein the thermal protection module includes an auxiliary power shut down module.

5. The welding-type power supply of claim 4, wherein the auxiliary power shut down module includes a shut down set point that corresponds to a shut down temperature, and the shut down temperature is greater than the fan on temperature.

6. The welding-type power supply of claim 5, wherein the power circuit includes an auxiliary power output and a relay in electrical communication with the auxiliary power output and the auxiliary power transformer, and wherein the relay is responsive to the auxiliary power shut down module.

7. The welding-type power supply of claim 1, wherein the temperature responsive component is a thermistor.

8. The welding-type power supply of claim 7, wherein the auxiliary power transformer includes a utility power winding, a control power winding, and a winding separator therebetween, and wherein the thermistor is mounted to and under the winding separator.

9. A welding-type power supply, comprising:
   means for converting input power to welding power, including means for transforming power into auxiliary power having a secondary winding;
   means for sensing the temperature of the means for transforming where the means for sensing the temperature is mounted over the secondary winding of the means for transforming power into auxiliary power;
   means for controlling the means for transforming, connected to and responsive to the means for sensing, and further connected to the means for converting.

10. The welding-type power supply of claim 9, further comprising means for turning on and off at least one fan mounted to cool at least the means for transforming, wherein the means for turning on and off is responsive to the means for the sensing.

11. The welding-type power supply of claim 10, wherein turning on and off includes turning the at least one fan off when the means for transforming is at a fan off temperature and turning the at least one fan on when the means for transforming is at a fan on temperature, wherein the fan off temperature is less than the fan on temperature.

12. The welding-type power supply of claim 11, wherein the means for controlling the converting includes means for disabling a utility output in response to the temperature of the means for transforming exceeding a threshold.

13. The welding-type power supply of claim 9, wherein the means for disabling includes a relay.

* * * * *